United States Patent
Van Ngo et al.

(12)

(10) Patent No.: US 6,429,141 B1
(45) Date of Patent: Aug. 6, 2002

(54) METHOD OF MANUFACTURING A SEMICONDUCTOR DEVICE WITH IMPROVED LINE WIDTH ACCURACY

(75) Inventors: Minh Van Ngo, Union City; Bhanwar Singh, Morgan Hill; Dawn Hopper; Carmen Morales, both of San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/589,105

(22) Filed: Jun. 8, 2000

Related U.S. Application Data

(62) Division of application No. 09/163,601, filed on Sep. 30, 1998, now Pat. No. 6,093,973.

(51) Int. Cl.[7] .............................................. H01L 21/461
(52) U.S. Cl. ...................... 438/723; 438/723; 438/724; 438/725; 430/318; 257/797
(58) Field of Search ................................ 438/723, 724, 438/725, 535, 636, 689; 430/312, 938, 318, 313, 311; 257/797, 750, 765

(56) References Cited

U.S. PATENT DOCUMENTS

| | | | |
|---|---|---|---|
| 5,747,388 A | | 5/1998 | Kusters et al. |
| 5,760,483 A | | 6/1998 | Bruce et al. |
| 5,814,563 A | | 9/1998 | Ding et al. |
| 5,835,226 A | | 11/1998 | Berman et al. |
| 6,005,295 A | * | 12/1999 | Hattori ........................ 275/797 |
| 6,008,129 A | | 12/1999 | Graff et al. |
| 6,143,476 A | * | 11/2000 | Ye et al. ...................... 430/318 |

* cited by examiner

*Primary Examiner*—David Nelms
*Assistant Examiner*—Dung A Le

(57) ABSTRACT

An oxide hard mask is formed during semiconductor device manufacturing between a deep ultraviolet photoresist and an anti-reflective coating to prevent interactions with the photoresist, thereby preventing reduction of a critical dimension of a patterned conductive layer. Embodiments include a method of manufacturing a semiconductor device comprising depositing a substantially nitrogen free oxide layer on the anti-reflective coating, such as a silicon oxide derived from tertaethyl orthosilicate by plasma enhanced chemical vapor deposition.

8 Claims, 3 Drawing Sheets

METHOD OF MANUFACTURING A SEMICONDUCTOR DEVICE WITH IMPROVED LINE WIDTH ACCURACY

This application is a Divisional of application Ser. No. 09/163,601 filed Sep. 30, 1998, now U.S. Pat. No. 6,093,973.

TECHNICAL FIELD

The present invention relates to a method of manufacturing a semiconductor device having sub-micron features. The present invention has particular applicability in manufacturing semiconductor devices with a design rule of about 0.18 microns and under with accurately dimensioned conductive features.

BACKGROUND ART

The escalating requirements for high density and performance associated with ultra-large scale integration require responsive changes in electrical interconnected patterns, which is considered one of the most demanding aspects of ultra-large scale integration technology. High-density demands for ultra-large scale integration semiconductor wiring require increasingly denser arrays with minimal spacing between conductive lines. This problem is exacerbated in manufacturing semiconductor devices having a design rule of about 0.18 microns and under.

In general, semiconductor devices comprise a substrate and elements such as transistors and/or memory cells thereon. Various interconnection layers are formed on the semiconductor substrate to electrically connect these elements to each other and to external circuits. The formation of interconnection layers is partly accomplished by employing conventional photolithographic techniques to form a photoresist mask comprising a pattern and transferring the pattern to an underlying layer or composite by etching the exposed underlying regions.

In accordance with conventional practices, interconnect structures comprise electrically conductive layers such as aluminum or alloys thereof. In the process of patterning the interconnect structure, an anti-reflective coating (ARC) is typically provided between the photoresist and the conductive layer to avoid deleterious reflections from the underlying conductive layer during patterning of the photoresist. The ARC can reduce the reflectivity of, for example, an aluminum metal layer to 25–30% from a reflectivity of about 80–90%. ARCs conventionally comprise materials such as silicon nitride, silicon oxynitride and titanium nitride, and are chosen for their optical properties and compatibility with the underlying conductive layer. However, many of the desirable ARCs contain basic components, such as nitrogen, which adversely interact with the photoresist material thereon during the photolithographic process.

A conventional interconnect structure is shown in FIG. 1, wherein substrate 8 has dielectric layer 10 thereon, conductive layer 12 on dielectric layer 10, ARC 14 on conductive layer 12 and a photoresist coating 16 on ARC 14. In very large scale integrated circuit applications, dielectric 10 has several thousand openings which can be either vias or lateral metallization lines where the metallization pattern serves to interconnect structures on or in the semiconductor substrate Dielectric layer 10 can comprise inorganic layers such as silicon dioxide, silicon nitride, silicon oxynitride, etc. or organic layers such as polyimide or combinations of both. Conductive layer 12 typically comprises a metal layer such as aluminum, copper, titanium, binary alloys thereof, ternary alloys, such as Al—Pd—Cu, Al—Pd—Nb, Al—Cu—Si or other similar low resistivity metal or metal based alloys, ARC 14 typically comprises a nitride of silicon or a nitride of a metal such as titanium.

To achieve high density line wiring, photoresist coating 16 is typically a deep ultraviolet (DUV) radiation sensitive photoresist capable of achieving line width resolutions of about 0.30 microns. During the photolithographic process, radiation is passed through mask 18 defining a desired conductive pattern to imagewise expose photoresist coating 16. After exposure to radiation, the photoresist layer is developed to form a relief pattern therein. It has been observed, however, that a residue remains at the photoresist interface and ARC, near the developed photoresist sidewall, resulting in a parabolic appearance, 22a and 22b, at the base of the photoresist known as "footing".

A conventional interconnect architecture after patterning of the photoresist is shown in FIG. 2. As shown, dielectric layer 10 overlays a device or a region of the semiconductor (not shown), conductive layer 12 overlays dielectric layer 10, ARC 14 overlays conductive layer 12 and a patterned photoresist, represented by photoresist line 20 overlays on ARC 14.

Photoresist line 20 of FIG. 2 further illustrates the footing phenomena where it shown that a portion of the base of the photoresist remains after patterning. The footing problem is typical of conventional photolithographic techniques employing a photoresist coating over an ARC in the manufacture of interconnections. Footing of the photoresist during patterning results in a loss of dimensional control in the subsequently patterned underlying conductive layer limiting the ability to resolve small spaces between conductive lines and thus limiting the wiring density.

Accordingly, there exists a need for a method of manufacturing a semiconductor device wherein a photoresist overlying an ARC can be accurately patterned. There is also a need for improving line width accuracy to achieve fine line conductive patterns with minimal inter-wiring spaces.

SUMMARY OF THE INVENTION

An advantage of the present invention is a semiconductor device having accurately dimensioned conductive features.

Another advantage of the present invention is a process of depositing an oxide film on a substrate.

A further advantage of the present invention is a process of manufacturing a semiconductor device by depositing an oxide film substantially free of nitrogen or other components that can adversely interact with a photoresist coating thereon.

Additional advantages and features of the invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to the present invention, the foregoing and other advantages are achieved in part by a semiconductor device comprising: a conductive layer; an anti-reflective coating on the conductive layer; and an oxide film on the anti-reflective coating. It is advantageous for the oxide film to have a thickness no greater than about 350 Å and to be free or substantially free of components that can adversely interact with a photoresist coating. The oxide film should be substantially free of components that act as bases, such as nitrogen components, which can poison the photoresist material during patterning of the photoresist.

Another aspect of the present invention is a method of depositing silicon oxide on a substrate. The method comprises: placing the substrate in a deposition chamber; evacuating the deposition chamber; introducing an organosilicon compound in the deposition chamber; introducing an oxidizing gas in the deposition chamber for reacting with the organosilicon compound; and reacting the organosilicon compound with the oxidizing gas to deposit silicon oxide on the substrate. It is advantageous to deposit the silicon oxide as a thin film having a thickness no greater than about 350 Å, e.g., no greater than 300 Å.

A further aspect of the present invention is a method of manufacturing a semiconductor device. The method comprises: forming a layer of a conductive material; forming an anti-reflective coating on the conductive layer; depositing an oxide film on the anti-reflective coating substantially free of basic components; forming a layer of photoresist material on the oxide film; and patterning the photoresist to form a photoresist mask.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the invention is capable of other and different embodiments, and its several details are capable of modifications in various obvious respects, all without departing from the present invention. Accordingly, the drawing and description are to be regarded as illustrative in nature, and not as restrictive.

DESCRIPTION OF THE INVENTION

The present invention stems form the discovery that employing an oxide hard mask between a DUV photoresist material and an ARC improves the resolution of the photolithographic process, thereby improving the accuracy of patterned features. In particular, employing a thin oxide film as a hard mask between the photoresist and ARC improves the vertical profiles, i.e. vertical sidewalls, of the photoresist lines, presumably by reducing or eliminating deleterious interactions between the photoresist and the underlying material.

In order to address the difficulty of accurately patterning a composite comprising an ARC underlayer and a photoresist material thereon with vertical profiles, it was necessary to gain an understanding of the causes of such problems. Upon investigation, it was found that strong interactions involving the chemistries of the ARC and a DUV photoresist coating undesirably occur, rendering it virtually impossible to pattern the DUV photoresist coating with an ARC thereunder to form vertical profiles in the patterned photoresist mask. Typically, ARC materials comprise basic components, such as nitrogen, which adversely affect a DUV photoresist during patterning. To address this problem, an oxide film was employed between the photoresist and ARC to prevent the adverse interactions therebetween. However, it was also found that such oxide films did not overcome the footing problem stemming from the ARC.

Figure 1:
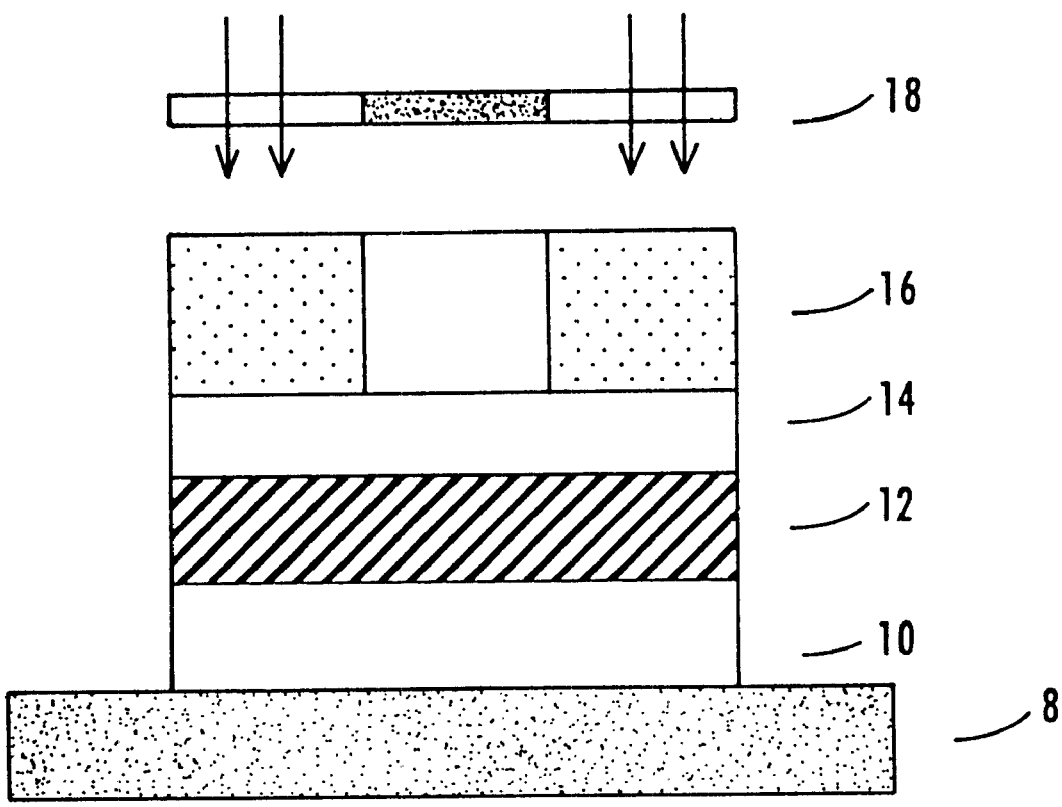
FIG. 1 schematically depicts a conventional interconnect structure prior to radiation exposure.
Figure 2:
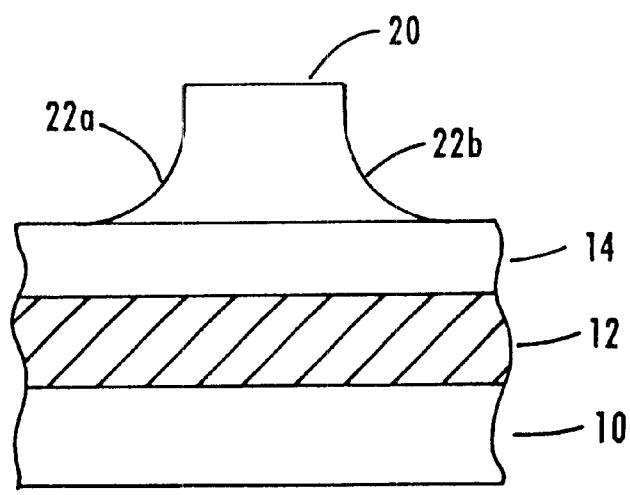
FIG. 2 schematically illustrates a conventional interconnect structure having a patterned photoresist line.

After extensive investigation, it was discovered that certain oxide films themselves contain nitrogen or other components which adversely interact with the photoresist. For example, it is known to utilize silane and nitrous oxide to form undoped silicon dioxide films. However, it was discovered that this process results in the presence of nitrogen or nitrogen products within or on the deposited silicon dioxide film. Hence, the nitrogen containing silicon dioxide film formed by this process suffered from the same photoresist footing problem as shown in FIG. 2. Moreover, as the feature size shrinks, footing becomes the most significant percent variation in sub $0.25\mu$ technology.

Figure 3:
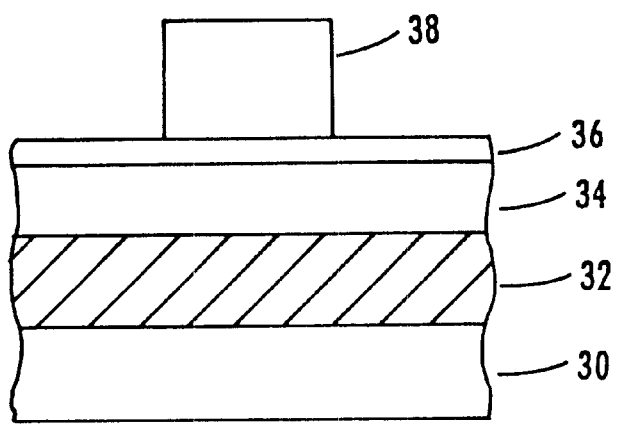
FIG. 3 schematically shows a sectional view of an interconnect structure of the present invention.

The present invention overcomes the undesirable interactions involving the chemistries of a DUV photoresist coating and the underlying oxide by employing an oxide forming technique which deposits a film of oxide substantially free, if not completely free, of basic components such as nitrogen or nitrogen products within or on the oxide film. In accordance with an embodiment of the present invention, a metal stack architecture for interconnect patterning is formed as shown in FIG. 3. It is understood that dielectric layer 30 can overlay a plurality of layers (not shown) necessary for device operations. Conductive layer 32 overlays dielectric layer 30, ARC 34 overlays on conductive layer 32 and oxide layer 36 overlays on ARC 34. As shown, photoresist pattern line 38 overlays oxide layer 36 exhibiting a vertical profile in contradistinction to the footing phenomena obtained with conventional practices.

The metal stack is configured for sub-half micron interconnect patterning. The dielectric layer 30 is about 4,000 Å to 16,000 Å thick and is formed by conventional dielectric forming techniques. Conductive layer 32 can comprise a composite of a plurality of layers. For example, a composite conductive layer can comprise a first layer comprising titanium at a thickness of about 250 Å deposited by vapor deposition. A second layer comprising aluminum with at 1% copper, at a thickness of about 5000 Å, is deposited on the titanium also by vapor deposition. ARC layer 34 comprises titanium nitride and is deposited at a thickness of about 1100 Å.

In an embodiment of the present invention, oxide layer 36 is formed at a thickness no greater than about 350 Å, e.g., no greater than about 300 Å. Particularly advantageous results have been achieved employing an oxide layer at a thickness of about 250 Å to about 350 Å, by further reducing reflectivity from the underlying conductive layer during patterning of the photoresist to approximately 0%.

In practicing embodiments of the invention, an oxide layer is formed by a plasma enhanced chemical vapor deposition (PECVD) process to deposit a silicon oxide film from an organosilicon compound as, for example, an alkoxysilane such as tetraethyl orthosilicate (TEOS). Alternatively, an oxide layer is formed by high density plasma (HDP) oxide deposition of a silicon oxide film. It is recognized herein that a HDP silicon oxide deposition technique which employs $SiH_4$ and $O_2$ also can lead to a thin oxide film free of adverse interactions with a photoresist coating thereon.

The resulting oxide films deposited by these techniques are substantially free, if not completely free, of basic components, such as nitrogen or nitrogen products. By substantially free it is understood that the components comprising the oxide film do not adversely affect the photolithographic chemistry between the photoresist and the underlying oxide. A patterned photoresist having an underlying oxide film substantially free of nitrogen, for example, would exhibit substantially vertical profiles and avoid the footing problems attendant upon employing conventional oxides or ARCs.

EXAMPLES

A composite layer comprising a dielectric layer, a conductive layer thereon and an ARC on the conducting layer was formed on a silicon substrate. The conductive layer comprises a first layer of titanium at a thickness of about 250 Å and was deposited by vapor deposition. A second layer of aluminum with at 1% copper, at a thickness of about 5000 Å, was then deposited on the titanium first layer also by vapor deposition. A titanium nitride layer, serving as an antireflective coating, was then deposited at a thickness of about 1100 Å on the conductive layer in accordance with conventional practices.

The silicon substrate having the composite thereon was then placed in a chemical vapor deposition chamber of a Novellus Concept I, manufactured by Novellus of California, employing a multi-station sequential deposition architecture having five stations. The chamber was evacuated to a pressure range of approximately 0 Torr to about 40 Torr, e.g. within a pressure range of about 2.2 Torr to about 1.6 Torr. The silicon substrate was heat soaked for at least about 20 seconds at a temperature of about 200° C. to about 320° C., and the substrate was then brought to a temperature of about 350° C. to about 420° C. and maintained at that temperature throughout the deposition process. TEOS was introduced into the deposition chamber at a flow rate within the range of approximately 0.2 ml/sec to about 5 ml/sec, e.g. about 0.6 ml/sec to about 1.4 ml/sec. A high frequency RF power was supplied to the deposition chamber between the range of about 500 Watts (W) to about 200 W, e.g. within the range of about 400 W to about 300 W. A low frequency power was supplied to the deposition chamber between a range of about 450 W to about 150 W, e.g., within the range of about 350 W and about 250 W. An oxidizing gas was also introduced into the deposition chamber for reaction with TEOS. For example, oxygen was introduced at a flow rate within the range of approximately 5,000 sccm to about 10,000 sccm causing TEOS and oxygen to react in the deposition chamber to deposit a thin silicon dioxide film on the surface of the composite layer. Each of the five stations deposited about 60 Å of silicon dioxide forming a silicon dioxide film having a total thickness of about 300 Å.

Alternatively, a thin silicon dioxide film was deposited by HDP oxide deposition, wherein the silicon substrate having the composite layer was positioned in a chemical vapor deposition chamber of an Ultima, manufactured by Applied Material, Inc. located in Santa Clara, Calif. The chamber was evacuated to a pressure range of approximately 1 mTorr to about 10 mTorr, e.g. within a pressure range of about 3 mTorr to about 7 mTorr. By Ar sputtering, the silicon substrate was then heated and maintained at a temperature of about 300° C. to about 430° C. An RF source power was supplied to the deposition chamber between the range of about 2000 W to about 5000 W, e.g. within the range of about 3000 W to about 4000 W and an RF bias power was also applied to the chamber between a range of about 1000 W to 5000 W, e.g., within the range of about 2000 W to 4000 W for Ar sputtering. $SiH_4$, $O_2$, and Ar were introduced into the deposition chamber at a flow rate within the range of approximately 40 sccm to about 200 sccm, about 80 sccm to about 500 sccm, and a flow of about 60 sccm to about 200 sccm, respectively. In the HDP chamber, $SiH_4$ and $O_2$ react to form $SiO_2$; simultaneously Ar is introduced into the chamber to partially etch the developing $SiO_2$ film, thereby preventing the formation of voids within the $SiO_2$ film, i.e., preventing the developing $SiO_2$ film from "pinching off" during deposition on the composite layer. Ultimately, a thin $SiO_2$ layer of about 250 Å to about 350 Å was deposited on the surface of the composite layer. As provided in Table 1, the deposited films exhibit good dielectric quality, high density and good step coverage.

TABLE 1

| Thin Film Properties | |
|---|---|
| Refractive Index | no less than about 1.40, e.g. about 1.47 |
| Stress | about $-2.5 \times 10^{-10}$ dyne/cm$^2$ |
| Uniformity | no greater than about 2.5% |

Figure 4:
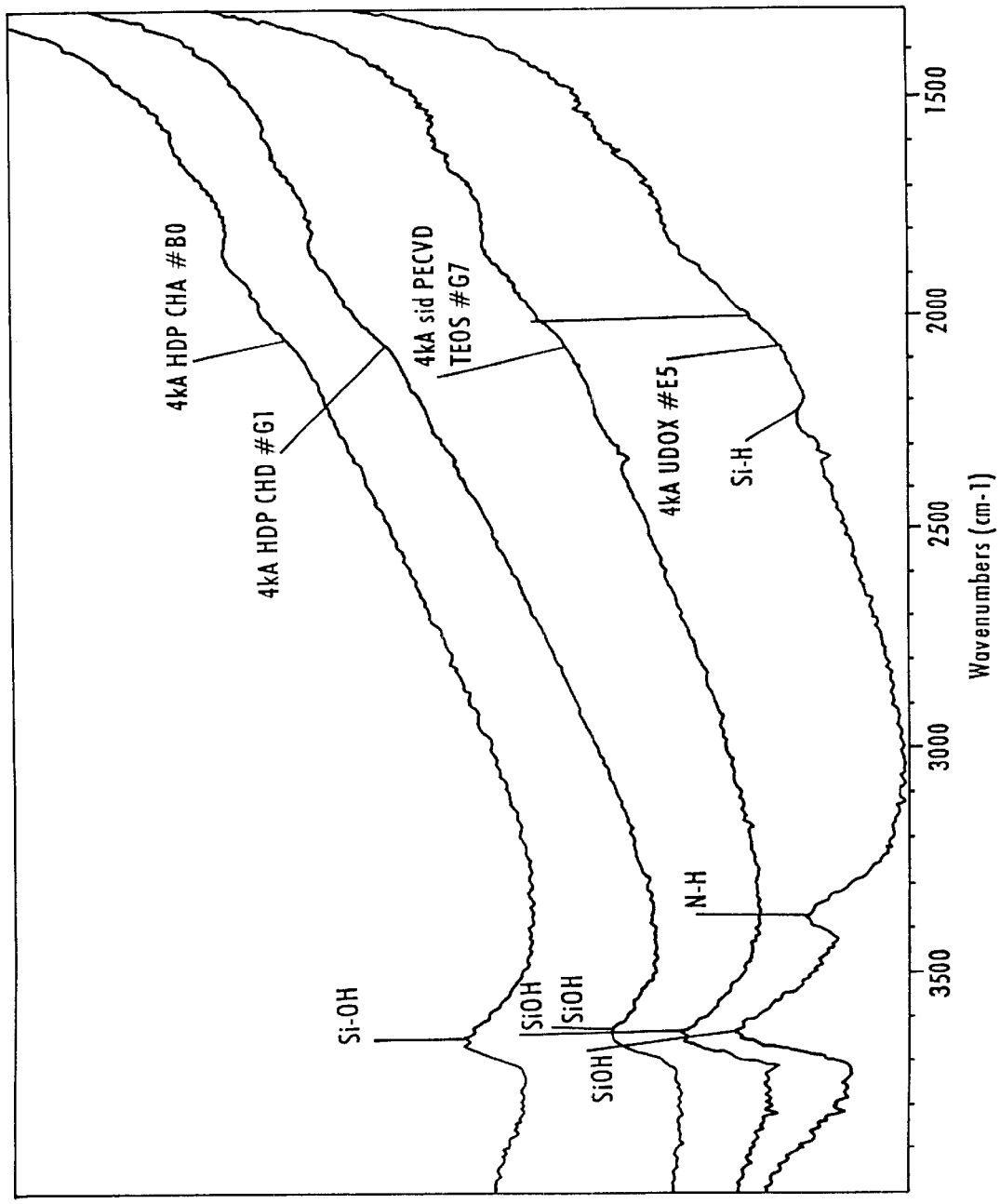
FIG. 4 comparatively illustrates FTIR spectra of silicon oxide films formed according to the present invention with a conventionally formed silicon oxide film.

Fourier Transform Infrared (FTIR) spectroscopy was used to detect the composition of the oxide films formed according to the TEOS or HDP techniques of the present invention. As shown in the FTIR spectra of FIG. 4, the oxide films formed according to the present invention have no detectable peaks assignable to a nitrogen component or other basic components within or on the film. In contrast, an N—H band is observed in the spectra of a silicon dioxide film formed utilizing a conventional silane process.

After forming the thin silicon dioxide film on the composite layer, a radiation sensitive photoresist, e.g., UV05 manufactured by Shipley Inc., located in Newton, Mass., was spin coated onto the silicon dioxide film at a thickness of about 5,000 to about 10,000 Å, and imagewise exposed thereby creating a latent image in the photoresist layer. The exposed photoresist was then subjected to an aqueous basic developer, e.g., CD 26 or CD320, manufactured by Shipley Inc., located in Newton, Mass., to form a patterned photoresist mask having substantial vertical profiles overlying on the silicon dioxide film.

Additional processing steps include etching the underlying oxide layer, anti-reflective coating and conductive layer to form conductive lines having a width of about $0.25\mu$ to $1.0\mu$.

The present invention is applicable to various phases of semiconductor manufacturing wherein a conductive layer is etched to form a pattern, particularly a pattern having about $0.18\mu$ to $1.0\mu$ geometry using an anti-reflective coating. Such patterns comprise, for example, the formation of aluminum, aluminum alloy copper and copper interconnections.

Only the preferred embodiment of the present invention and an example of its versatility is shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, which method comprises:
   forming a layer of a conductive material;
   forming an anti-reflective coating on the conductive layer;
   depositing an oxide film on the anti-reflective coating substantially free of basic components;

forming a layer of photoresist material on the oxide film; and patterning the photoresist material to form a photoresist mask.

2. The method of claim 1, comprising depositing the oxide film on the anti-reflective coating to a thickness of no greater than about 350 Å.

3. The method of claim 2, comprising depositing the oxide film by high-density plasma deposition of silicon oxide.

4. The method of claim 2, comprising depositing the oxide film by plasma enhanced chemical vapor deposition of an organosilicon compound.

5. The method of claim 4, comprising depositing the oxide film in a plurality of layers.

6. The method of claim 5, comprising depositing each layer at a thickness no greater than about 60 Å.

7. The method of claim 2, further comprising etching the conductive layer, using the photoresist mask, to form a conductive feature having substantially vertical side surfaces.

8. The method of claim 1, wherein the basic components include nitrogen or nitrogen products.

* * * * *